(12) United States Patent
Tashiro

(10) Patent No.: US 10,775,444 B2
(45) Date of Patent: Sep. 15, 2020

(54) SECONDARY BATTERY SYSTEM AND DETERIORATION STATE ESTIMATION METHOD FOR SECONDARY BATTERY

(71) Applicant: TOYOTA JIDOSHA KABUSHIKI KAISHA, Toyota-shi, Aichi-ken (JP)

(72) Inventor: Hiroki Tashiro, Nisshin (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 17 days.

(21) Appl. No.: 16/297,902

(22) Filed: Mar. 11, 2019

(65) Prior Publication Data

US 2019/0285702 A1 Sep. 19, 2019

(30) Foreign Application Priority Data

Mar. 19, 2018 (JP) .................... 2018-050858

(51) Int. Cl.
*G01R 31/392* (2019.01)
*G01R 31/389* (2019.01)
(Continued)

(52) U.S. Cl.
CPC ....... *G01R 31/392* (2019.01); *G01R 31/3648* (2013.01); *G01R 31/389* (2019.01);
(Continued)

(58) Field of Classification Search
CPC .. G01R 31/389; G01R 31/392; G01R 31/367; G01R 31/3842; G01R 31/374;
(Continued)

(56) References Cited

U.S. PATENT DOCUMENTS 6,160,380 A * 12/2000 Tsuji .................. G01R 31/3648
320/132
7,202,632 B2 * 4/2007 Namba ................ G01R 31/367
320/132
(Continued)

FOREIGN PATENT DOCUMENTS

JP 2011-185619 A 9/2011
JP 2014-238948 A 12/2014
JP 2015-161631 A 9/2015

OTHER PUBLICATIONS

U.S. Appl. No. 16/238,008, Hiroki Tashiro, filed Jan. 2, 2019.

*Primary Examiner* — Vinh P Nguyen
(74) *Attorney, Agent, or Firm* — Sughrue Mion, PLLC

(57) ABSTRACT

A secondary battery system includes a control device that estimates a reaction resistance based on the difference between a first impedance and a second impedance. Each of the first and second impedance is calculated based on first, second, and third change amount when the current value of the secondary battery is varied with corresponding period. The first change amount is a change amount of a detection value of a voltage sensor in a period in which the phase of the current value is inverted from an initial phase to an opposite phase, the second change amount is a change amount of the detection value of the voltage sensor in a period in which the phase of the current value is returned from the opposite phase to the initial phase, and the third change amount is a difference of the current value between the initial phase and the opposite phase.

6 Claims, 11 Drawing Sheets

(51) Int. Cl.
  *G01R 31/36* (2020.01)
  *H01M 10/48* (2006.01)
  *G01R 31/3842* (2019.01)

(52) U.S. Cl.
  CPC ...... *G01R 31/3842* (2019.01); *H01M 10/486* (2013.01); *H01M 2220/20* (2013.01)

(58) Field of Classification Search
  CPC ............... G01R 31/3648; G01R 31/36; G01R 31/3828; G01R 31/396; G01R 19/16542; G01R 31/3647; G01R 31/387; G01R 31/50; G01R 31/52; G01R 31/007; G01R 31/371; G01R 31/382; G01R 31/388; H01M 10/486; H01M 10/4257; H01M 2010/4271; H01M 10/42; H01M 2010/4278; H01M 10/44; H01M 10/056; H01M 10/425; H01M 10/617; H01M 10/625; H01M 10/633; H01M 4/485; H01M 10/465; H01M 2220/20; H01M 10/48; H02J 7/0021; H02J 7/00; H02J 7/0047; H02J 7/007; H02J 7/1461; H02J 7/0024; H02J 7/0031; H02J 7/0069; H02J 7/04; B60L 58/12; B60L 2210/40; B60L 50/51; B60L 58/10; B60L 1/00; B60L 2240/545; B60L 2240/547; B60L 2240/549; B60L 2260/44; B60L 7/16; B60L 3/0046; B60L 3/12; B60L 58/13; B60L 58/14; B60L 58/16; B60L 58/21; B60K 6/28; B60Y 2200/91; B60Y 2200/92

See application file for complete search history.

(56) References Cited

U.S. PATENT DOCUMENTS

| | | | |
|---|---|---|---|
| 10,054,645 B2* | 8/2018 | Kobayashi | H01M 10/04 |
| 2019/0064282 A1* | 2/2019 | Haga | B60L 58/12 |
| 2019/0162796 A1* | 5/2019 | Soejima | G01R 31/3842 |

* cited by examiner

LONG-PERIOD IMPEDANCE $Z_L$

SHORT-PERIOD IMPEDANCE $Z_S$

DIFFERENCE $\Delta Z = Z_L - Z_S$

SECONDARY BATTERY SYSTEM AND DETERIORATION STATE ESTIMATION METHOD FOR SECONDARY BATTERY

INCORPORATION BY REFERENCE

The disclosure of Japanese Patent Application No. 2018-050858 filed on Mar. 19, 2018 including the specification, drawings and abstract is incorporated herein by reference in its entirety.

BACKGROUND

1. Technical Field

The disclosure relates to a secondary battery system and a deterioration state estimation method for a secondary battery, and more specifically, relates to a technology for estimating a reaction resistance of the secondary battery.

2. Description of Related Art

In recent years, electrically driven vehicles (hybrid vehicles, electric vehicles and the like) equipped with secondary battery systems for traveling have prevailed. Each secondary battery included in the secondary battery systems can deteriorate in connection with use of the secondary battery and time elapse. Therefore, it is desired to estimate a deterioration state of the secondary battery. Hence, there have been proposed a method of estimating the deterioration state of the secondary battery based on the impedance (internal resistance) of the secondary battery (for example, Japanese Patent Application Publication No. 2011-185619).

Patent Literature 1
Japanese Patent Application Publication No. 2011-185619
Patent Literature 2
Japanese Patent Application Publication No. 2015-161631
Patent Literature 3
Japanese Patent Application Publication No. 2014-238948

SUMMARY

Generally, the impedance of the secondary battery is roughly classified into a direct-current resistance, a reaction resistance and a diffusion resistance. The reaction resistance of the secondary battery corresponds to a deterioration mode caused by a film formation on an active material surface of the secondary battery. As a specific example, for a lithium-ion secondary battery, there is known a deterioration (a so-called lithium deposition) in which metallic lithium is deposited on a negative electrode surface. By estimating the reaction resistance of the lithium-ion secondary battery at a high accuracy, it is possible to exactly predict the degree of the lithium deposition (or the degree of change in tolerance of the secondary battery for the lithium deposition).

An outline of an estimation method for the reaction resistance will be described (details will be described later). The current value of the secondary battery is varied with different periods (a long period and a short period), and the voltage values of the secondary battery for the periods are detected by the voltage sensor. Furthermore, an impedance for the long period is calculated from a relation between the current value and voltage value of the secondary battery for the long period, and an impedance for the short period is calculated from a relation between the current value and voltage value of the secondary battery for the short period. Then, the difference between the impedance for the long period and the impedance for the short period is evaluated. The difference corresponds to the reaction resistance of the secondary battery. By this technique of obtaining the difference in impedance when the current value is varied with different periods, it is possible to separate the reaction resistance from the other impedance components (the direct-current resistance and the diffusion resistance).

The voltage value of the secondary battery is determined by an electromotive force and a voltage drop amount in connection with charge and discharge of the secondary battery. Depending on state or use manner of the secondary battery, the electromotive force (=open circuit voltage+ polarizing voltage) of the secondary battery can change during a time when the current value of the secondary battery is being varied (during a time shorter than one period). For example, when the electromotive force of the secondary battery changes during the time when the current value of the secondary battery is being varied with a long period, the impedance for the long period cannot be exactly calculated, and therefore, the estimation accuracy of the reaction resistance can decrease. When the estimation accuracy of the reaction resistance decreases, the deterioration mode (the degree of the lithium deposition, and the like) corresponding to the reaction resistance cannot be also estimated at a high accuracy. That is, there is a possibility of decrease in the estimation accuracy of the deterioration state of the secondary battery.

The disclosure has been made for solving the above problem, and an object of the disclosure is to improve the estimation accuracy of the deterioration state of the secondary battery, in a secondary battery system or a deterioration state estimation method for a secondary battery.

A secondary battery system according to an aspect of the disclosure includes a secondary battery, an electric circuit, a voltage sensor and a control device. In the secondary battery, an electrode including an active material is impregnated with an electrolyte. The electric circuit includes at least one of a power supply circuit to supply electric power to the secondary battery and a load circuit to consume electric power of the secondary battery. The voltage sensor detects the voltage value of the secondary battery. The control device controls current to be received or output by the secondary battery, by controlling the electric circuit. The control device executes a reaction resistance estimation process of estimating a reaction resistance. The reaction resistance is an impedance component relevant to transfer of an electric charge on an interface between the electrolyte and the active material. The control device executes a first calculation process and a second calculation process and estimate the reaction resistance based on a difference between a first impedance calculated in the first calculation process and a second impedance calculated in the second calculation process, in the reaction resistance estimation process. The first calculation process is a process of calculating the first impedance of the secondary battery when a current value of the secondary battery is varied with a first period. The second calculation process is a process of calculating the second impedance of the secondary battery when the current value of the secondary battery is varied with a second period shorter than the first period. Each of the first and second calculation processes is a process of varying the current value with a corresponding period of the first and second periods and calculating a corresponding impedance of the first and second impedances based on a first change amount, a second change amount and a third change amount. The first change amount is a change amount of a detection value of the voltage sensor in a time period in which a phase of the current value is inverted from an initial phase to an opposite phase. The second change amount is a change amount of the detection value of the voltage sensor in a time period in which the phase of the current value is returned from the opposite phase to a phase equal to the initial phase. The third change amount is a change amount of the current value in a time period in which the phase of the current value is inverted from the initial phase to the opposite phase.

With the above secondary battery system, it is possible to improve the estimation accuracy of the deterioration state of the secondary battery.

Each of the first and second calculation processes may be a process of varying the current value with the corresponding period, acquiring a first detection value, a second detection value and a third detection value, and calculating the corresponding impedance based on a difference between the third detection value and the second detection value, a difference between the second detection value and the first detection value, and the third change amount. The first detection value is the detection value of the voltage sensor when the phase of the current value is the initial phase. The second detection value is the detection value of the voltage sensor when the phase of the current value is the opposite phase. The third detection value is the detection value of the voltage sensor when the phase of the current value is the phase equal to the initial phase.

The control device may calculate the corresponding impedance in accordance with Expression (A):

$$Z=\{(V3-V2)-(V2-V1)\}/2\Delta I \quad (A)$$

where Z represents the corresponding impedance, V1, V2, and V3 represent the first, second, and third detection values respectively, and $\Delta I$ represents the change amount of the current value.

With the above configuration, the impedance of the secondary battery is calculated from the change amount (the difference between the second detection value and the first detection value) of the detection value of the voltage sensor in a period in which the phase of the current value of the secondary battery is inverted from the initial phase to the opposite phase, the change amount (the difference between the third detection value and the second detection value) of the detection value of the voltage sensor in a period in which the phase of the current value is returned from the opposite phase to the phase equal to the initial phase, and the change amount of the current value in a period in which the phase of the current value is inverted or in a period in which the phase of the current value is returned to the original phase. Although details will be described later, in the case of calculating the difference between the change amount of the detection value (closed circuit voltage (CCV)) of the voltage sensor in a period in which the phase of the current value is inverted and the change amount of the detection value (CCV) of the voltage sensor in the period in which the phase of the current value is returned to the original phase and dividing the electromotive force of the secondary battery into open circuit voltage (OCV) and polarizing voltage to discuss each voltage component, the change amount of the OCV in a period in which the phase of the current value is inverted and the change amount of the OCV in the period in which the phase of the current value is returned to the original phase are cancelled out by the difference, and the change amount of the polarizing voltage in a period in which the phase of the current value is inverted and the change amount of the polarizing voltage in a period in which the phase of the current value is returned to the original phase are cancelled out by the difference. Thereby, as shown in Expression (A), the impedance (Z) is expressed by only V1 to V3, each of which are the CCV capable of being measured by the voltage sensor. Accordingly, it is possible to calculate the impedances for the first and second periods at a high accuracy, and as a result, it is possible to improve the estimation accuracy of the reaction resistance also.

The control device may vary the current value with a rectangular wave having the corresponding period, in each of the first and second calculation processes. Each of the first to third detection values may be a value that is detected by the voltage sensor when half of the corresponding period has elapsed since a change in the current value.

With the above configuration, when the current value is varied with the rectangular wave, the voltage detection by the voltage sensor is not performed until half of the period has elapsed since the change in the current value. Therefore, the time for the charge and discharge of capacity components (more specifically, a positive electrode capacity C1 and a negative electrode capacity C2 described later) included in an equivalent circuit of the secondary battery is secured. Thereby, in the calculation of the difference between the change amount of the CCV in a period in which the phase of the current value is inverted and the change amount of the CCV in a period in which the phase of the current value is being returned to the original phase, the difference between a sufficiently charged capacity component and a sufficiently discharged capacity component is calculated, so that the capacity components cancel out each other. As a result, influence of the capacity components of the secondary battery is removed, and the calculation accuracy of the impedance is improved. Therefore, it is possible to further improve the estimation accuracy of the reaction resistance.

The control device may execute the first and second calculation processes when at least one of a condition that the magnitude of the current value is larger than a predetermined value, a condition that the temperature of the secondary battery is lower than a predetermined temperature, and a condition that the SOC of the secondary battery is lower than a predetermined level is satisfied.

In the case where one of the three conditions is satisfied, the change amount of the electromotive force becomes large easily even when the change amount of the SOC in connection with the variation in the current is relatively small (the reason will be described later). Therefore, the estimation accuracy of the reaction resistance decreases easily. Accordingly, with the above configuration, in the case where at least one of the three conditions is satisfied, the first and second calculation processes are executed. Thereby, it is possible to restrain the decrease in the estimation accuracy of the reaction resistance.

In a deterioration state estimation method for a secondary battery according to another aspect of the disclosure, the secondary battery is provided with a voltage sensor that detects the voltage value of the secondary battery. The deterioration state estimation method for the secondary battery includes: calculating a first impedance of the secondary battery, from a first change amount, a second change amount and a third change amount when a current value of the secondary battery is varied with a first period; calculating a second impedance of the secondary battery, from the first change amount, the second change amount and the third change amount when the current value of the secondary battery is varied with a second period shorter than the first period; and estimating a reaction resistance based on a difference between the first impedance and the second impedance, the reaction resistance being an impedance component relevant to transfer of an electric charge on an interface between an electrolyte and an active material of the secondary battery. The first change amount is a change amount of a detection value of the voltage sensor in a period in which a phase of the current value is inverted from an initial phase to an opposite phase. The second change amount is a change amount of the detection value of the voltage sensor in a time period in which the phase of the current value is returned from the opposite phase to a phase equal to the initial phase. The third change amount is a change amount of the current value in a time period in which the phase of the current value is inverted from the initial phase to the opposite phase.

With the above method, it is possible to improve the estimation accuracy of the reaction resistance.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
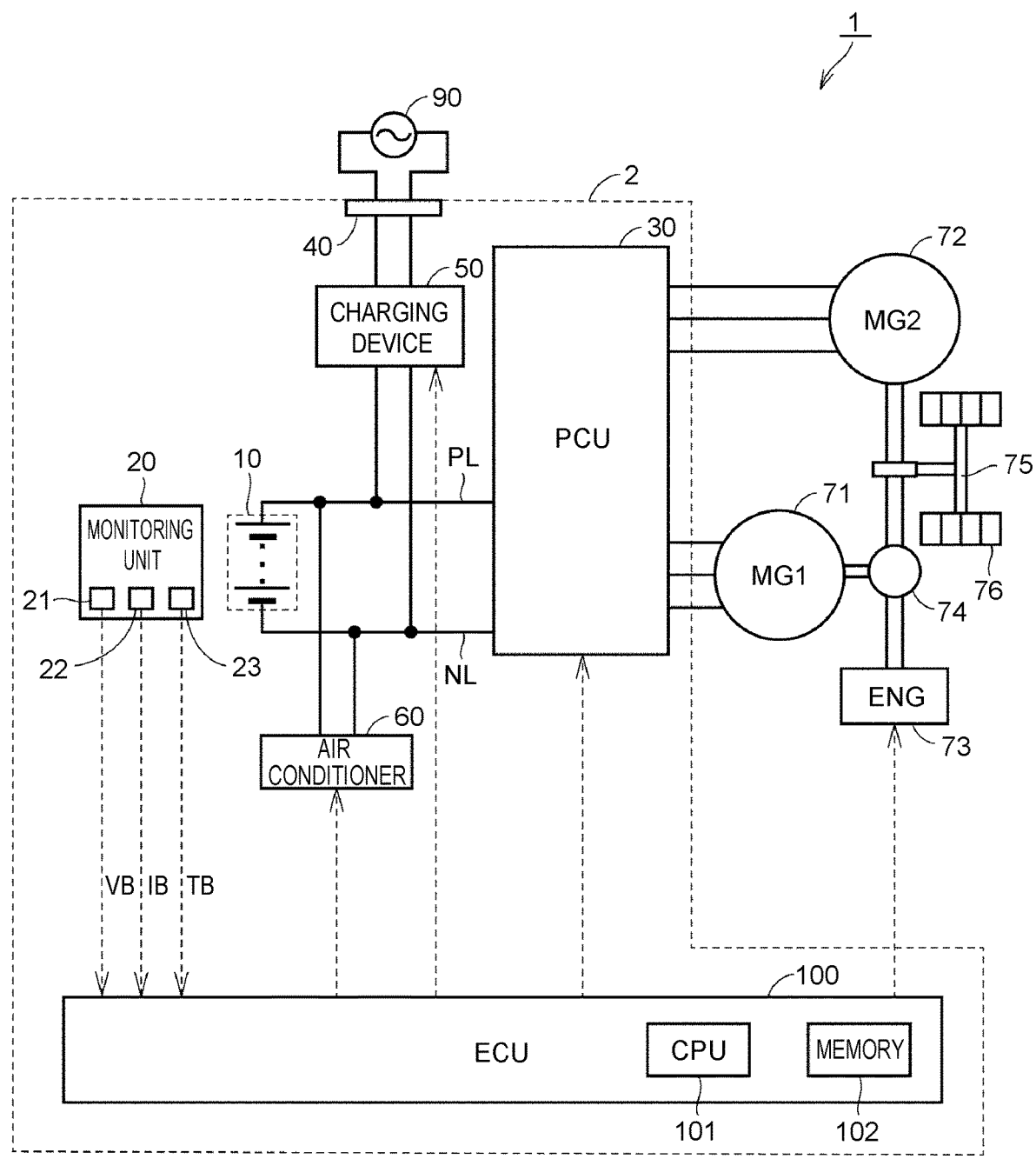
FIG. 1 is a diagram schematically showing a whole configuration of a vehicle equipped with a secondary battery system according to an embodiment.

Hereinafter, an embodiment of the disclosure will be described in detail, with reference to the drawings. In the drawings, identical or equivalent parts are denoted by identical reference characters, and descriptions of the parts are omitted.

Hereinafter, a configuration in which a secondary battery system according to the embodiment is equipped in a vehicle will be described as an example. However, use purpose of the secondary battery system according to the disclosure is not limited to vehicles, and for example, the secondary battery system may be used for a stationary secondary battery.

Embodiment

Configuration of Secondary Battery System

FIG. 1 is a diagram schematically showing a whole configuration of a vehicle equipped with a secondary battery system according to the embodiment. With reference to FIG. 1, a vehicle 1 in the embodiment is a plug-in hybrid vehicle, and includes a secondary battery system 2. However, the vehicle capable of being equipped with the secondary battery system according to the disclosure is not limited to a plug-in hybrid vehicle. The secondary battery system according to the disclosure can be equipped in general vehicles. Therefore, the vehicle 1 may be an electric vehicle or a fuel-cell vehicle. The use purpose of the secondary battery system according to the disclosure is not limited to vehicles, and for example, the secondary battery system may be used for a stationary secondary battery.

The secondary battery system 2 includes a battery 10, a monitoring unit 20, a power control unit (PCU) 30, an inlet 40, a charging device 50, an air-conditioner 60 and an electronic control unit (ECU) 100. In addition to the secondary battery system 2, the vehicle 1 further includes motor generators 71, 72, an engine 73, a power split device 74, a driving shaft 75 and driving wheels 76.

Each of the motor generators 71, 72 is an alternating-current rotating machine, and for example, is a three-phase alternating-current synchronous motor in which a permanent magnet (not illustrated) is buried in a rotor. The motor generator 71 is used, mainly as an electric generator that is driven by the engine 73 through the power split device 74. Electric power generated by the motor generator 71 is supplied to the motor generator 72 or the battery 10, through the PCU 30.

The motor generator 72 operates, mainly as an electric motor, and drives the driving wheels 76. The motor generator 72 is driven by receiving at least one of electric power from the battery 10 and electric power generated by the motor generator 71, and driving power of the motor generator 72 is transmitted to the driving shaft 75. Meanwhile, at the time of braking of the vehicle or at the time of acceleration reduction on a descending slope, the motor generator 72 operates as an electric generator to regenerate electric power. Electric power generated by the motor generator 72 is supplied to the battery 10 through the PCU 30.

The engine 73 is an internal combustion engine that outputs dynamic power by converting combustion energy generated when an air-fuel mixture of air and fuel is combusted into kinetic energy of a moving body (not illustrated) such as a piston and a rotor.

The power split device 74 includes a planetary gear mechanism (not illustrated) having three axes for a sun gear, a carrier and a ring gear, for example. The power split device 74 splits the dynamic power output from the engine 73, into dynamic power for driving the motor generator 71 and dynamic power for driving the driving wheels 76.

The battery 10 is an assembled battery configured to include a plurality of cells. In the embodiment, each cell is a lithium-ion secondary battery. The battery 10 stores electric power for driving the motor generators 71, 72, and supplies the electric power to the motor generators 71, 72 through the PCU 30. Further, at the time of the electric power generation of the motor generators 71, 72, the battery 10 is charged by receiving the generated electric power through the PCU 30.

The monitoring unit 20 includes a voltage sensor 21, a current sensor 22 and a temperature sensor 23. The voltage sensor 21 detects a voltage VB of the battery 10. The current sensor 22 detects a current IB that is received or output by the battery 10. The temperature sensor 23 detects a temperature TB of the battery 10. Each sensor outputs a signal indicating the detection result, to the ECU 100. A configuration of the battery 10 and the monitoring unit 20 will be described in more detail, with FIG. 2.

The PCU 30 executes bidirectional electric power conversion between the battery 10 and the motor generators 71, 72, in accordance with a control signal from the ECU 100. The PCU 30 is configured to be capable of controlling states of the motor generators 71, 72 separately, and for example, can put the motor generator 71 into a regeneration state (electric power generation) while putting the motor generator 72 into a powering state. For example, the PCU 30 is configured to include two inverters that are provided corresponding to the motor generators 71, 72 and a converter that raises direct-current voltage to be supplied to each inverter, to equal to or higher than an output voltage of the battery 10 (the inverters and the converter are not illustrated).

The inlet 40 is configured to be capable of being connected with a connector (not illustrated) of a charging cable. The inlet 40 receives electric power supply from an external power supply 90 provided in the exterior of the vehicle 1, through the charging cable. For example, the external power supply 90 is a commercial alternating-current power supply. Electric power from the external power supply 90 is supplied to the charging device 50 through the inlet 40.

The charging device 50 converts the electric power supplied from the external power supply 90 through the inlet 40, into electric power suitable for the charge (plug-in charge) of the battery 10, in accordance with a control signal from the ECU 100. For example, the charging device 50 is configured to include an inverter and a converter (which are not illustrated). The electric power after the electric power conversion by the charging device 50 is output between electric power lines PL, NL.

The air conditioner 60 conditions the air in a vehicle cabin, by air cooling or air heating in the vehicle cabin, in accordance with a control signal from the ECU 100. The air conditioner 60 is configured to include a compressor (not illustrated). The air conditioner 60 is electrically connected to the electric power lines PL, NL, and is driven by the electric power from the battery 10.

The PCU 30, the charging device 50 and the air-conditioner 60 correspond to the "electric circuit" according to the disclosure. More specifically, the charging device 50 corresponds to the "power supply circuit" according to the disclosure. The PCU 30 and the air conditioner 60 correspond to the "load circuit" according to the disclosure. However, all of the PCU 30, the charging device 50 and the air conditioner 60 are not essential constituents for the secondary battery system 2. For example, the charging device 50 may be excluded, or the air conditioner 60 may be excluded. Further, the "power supply circuit" may be a DC-DC converter that performs electric power conversion between the battery 10 and an auxiliary battery, although the DC-DC converter is not illustrated.

The ECU 100 is configured to include a central processing unit (CPU) 101, a memory (read only memory (ROM) and random access memory (RAM)) 102, and an input-output port (not illustrated) that receives and outputs various signals. The ECU 100 executes various processes for controlling the vehicle 1 to desired states, based on signals received from the sensors and programs and maps stored in the memory 102.

As a main control to be executed by the ECU 100, there is a charge-discharge control for the battery 10. More specifically, the ECU 100 controls the charge-discharge of the battery 10 by controlling the engine 73 and the PCU 30. In addition, the ECU 100 can discharge the battery 10 by controlling the air conditioner 60, and can charge the battery 10 by controlling the charging device 50. Further, the ECU 100 executes a "deterioration state estimation process" of estimating a reaction resistance of the battery 10. The deterioration state estimation process will be described later in detail.

Figure 2:
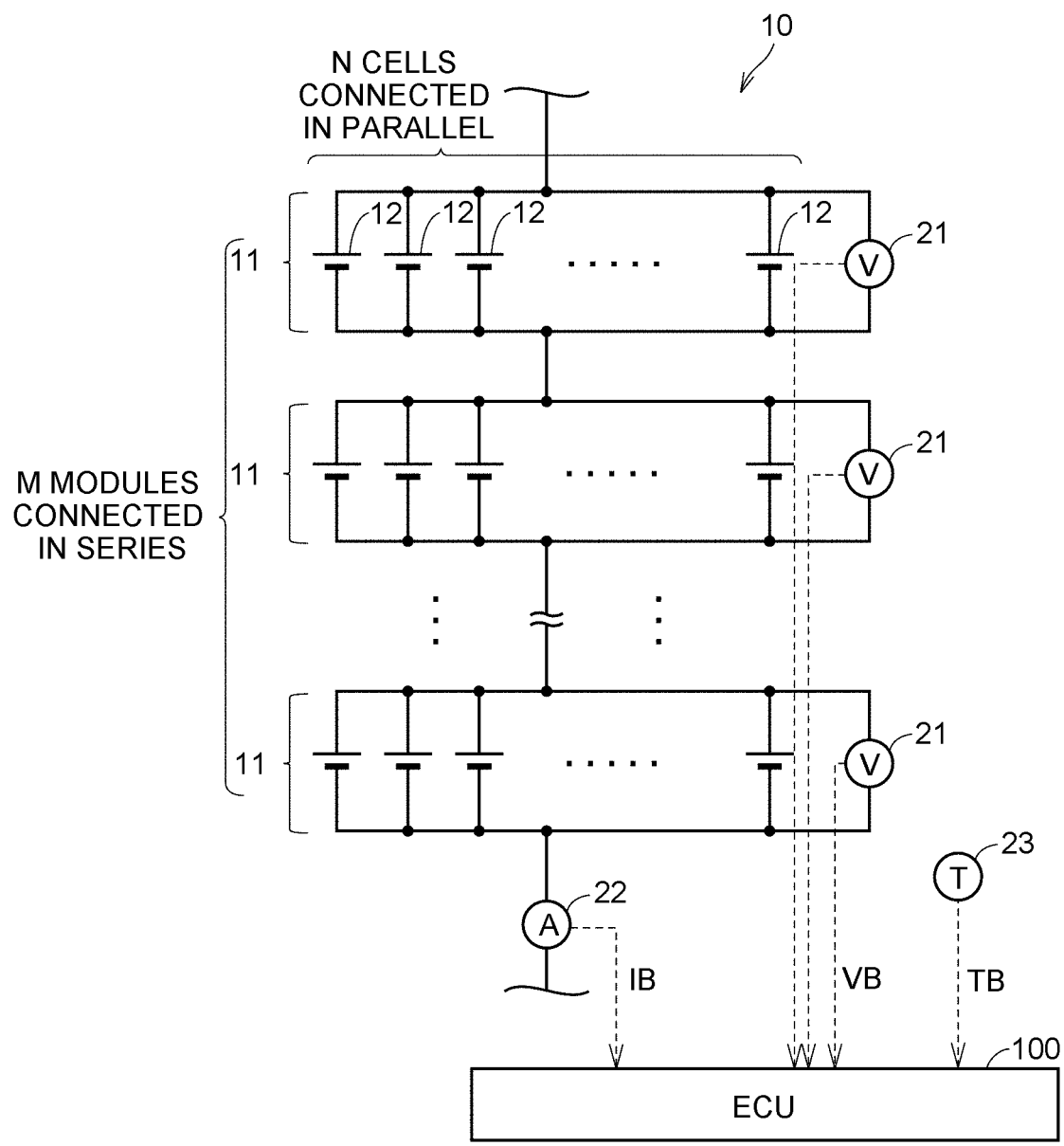
FIG. 2 is a diagram showing a configuration of a battery and a monitoring unit in more detail.

FIG. 2 is a diagram showing the configuration of the battery 10 and the monitoring unit 20 in more detail. With reference to FIG. 1 and FIG. 2, for example, the battery 10 includes M modules 11 connected in series. Each module 11 includes N cells 12 connected in parallel. Each of M and N is a natural number of 2 or more.

The voltage sensor 21 detects the voltage of each module 11. The current sensor 22 detects the current IB that flows through all modules 11. The temperature sensor 23 detects the temperature of the battery 10. The unit of the monitoring by the voltage sensor 21 is not limited to the module. The monitoring may be performed in units of the cell 12, or may be performed in units of a plurality of adjacent cells 12 (the number of the adjacent cells 12 is less than the number of the cells in the module). Further, the unit of the monitoring by the temperature sensor 23 is not particularly limited, and for example, the temperature may be detected in units of the module (or in units of the cell).

Figure 3:
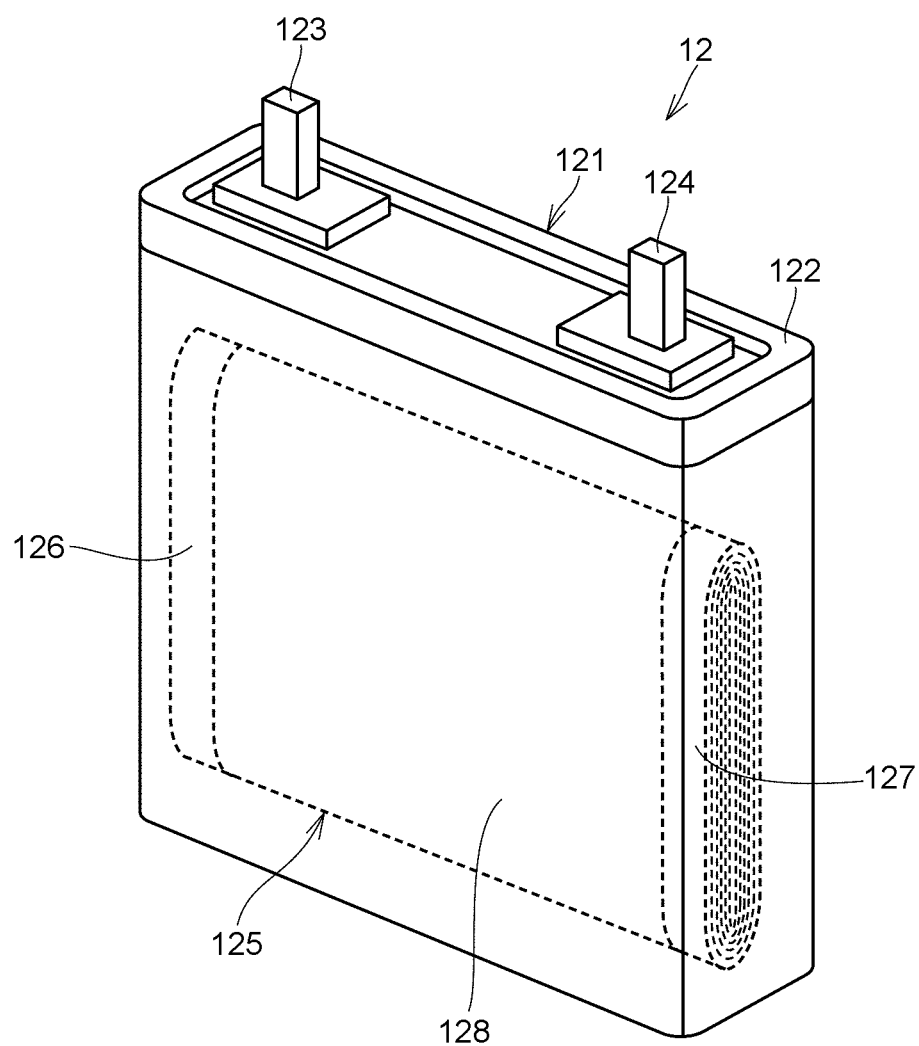
FIG. 3 is a diagram for describing a configuration of each cell in more detail.

FIG. 3 is a diagram for describing a configuration of each cell 12 in more detail. FIG. 3 is a perspective diagram in which the interior of the cell 12 is shown.

With reference to FIG. 3, the cell 12 includes a battery case 121 having a square shape (a roughly rectangular solid shape), for example. An upper surface of the battery case 121 is sealed with a lid 122. One end of each of the positive electrode terminal 123 and the negative electrode terminal 124 protrudes from the lid 122 to the exterior. The other ends of the positive electrode terminal 123 and the negative electrode terminal 124 are connected to an internal positive electrode terminal and an internal negative electrode terminal (which are not illustrated), in the interior of the battery case 121. An electrode body 125 is contained in the interior of the battery case 121. The electrode body 125 is formed by laminating a positive electrode 126 and a negative electrode 127 with a separator 128 interposed therebetween and winding the laminated body. An electrolyte is held by the positive electrode 126, the negative electrode 127, the separator 128 and the like.

For the positive electrode 126, the negative electrode 127, the separator 128 and the electrolyte, compositions and materials conventionally known as the positive electrode, negative electrode, separator and electrolyte of the lithium-ion secondary battery can be used respectively. As an example, for the positive electrode 126, a ternary material in which nickel or manganese is substituted for some lithium cobalt oxide can be used. For the negative electrode 127, for example, carbon (graphite) or a silicon-based material can be used. For the separator 128, a polyolefin (for example, polyethylene or polypropylene) can be used. The electrolyte contains an organic solvent (for example, a mixed solvent of dimethylcarbonate (DMC), ethylmethylcarbinate (EMC) and ethylenecarbonate (EC)), a lithium salt (for example, $LiPF_6$), an addition agent (for example, lithiumbis(oxalate) borate (LiBOB) or $Li[PF_2(C_2O_4)_2]$), and the like.

The internal configuration of the battery 10, the configuration of the cell and the unit of the monitoring by the monitoring unit 20 each are just examples, and are not particularly limited. Therefore, hereinafter, the plurality of modules 11 is not discriminated from each other, and the plurality of cells 12 is not discriminated from each other. The plurality of modules 11 and the plurality of cells 12 are comprehensively referred to as merely "battery 10".

Impedance Components of Battery

The battery 10 configured as described above includes various impedance components described below.

Figure 4:
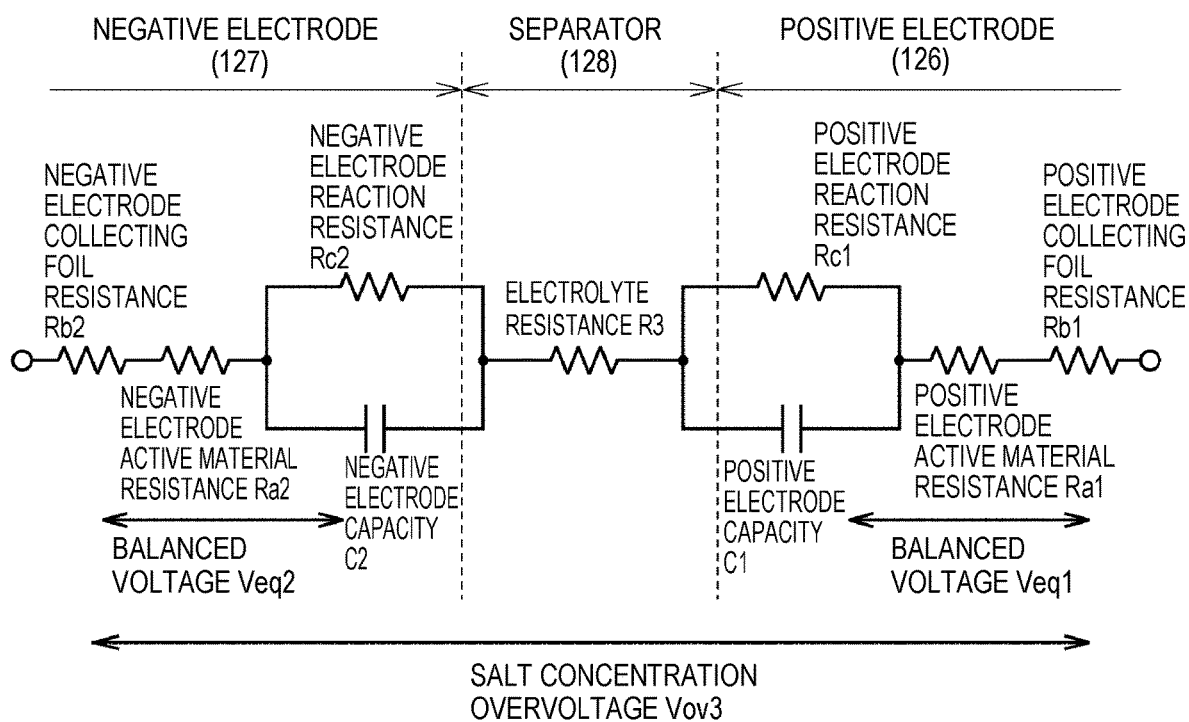
FIG. 4 is a diagram for describing impedance components of the battery.

FIG. 4 is a diagram for describing impedance components of the battery 10. FIG. 4 shows an exemplary equivalent circuit diagram of the positive electrode 126, the negative electrode 127 and the separator 128 of the battery 10 (more specifically, each cell 12). The impedance component of the battery 10 is roughly classified into a direct-current resistance Rdc, a reaction resistance Rc and a diffusion resistance Rd.

The direct-current resistance Rdc is an impedance component relevant to movement of an ion and an electron between the positive electrode 126 and the negative electrode 127. The direct-current resistance Rdc increases, for example, due to a biased salt concentration distribution in the electrolyte when a high load is applied to the battery 10 (when a high voltage is applied or when a large current is applied). In the equivalent circuit diagram shown in FIG. 4, the direct-current resistance Rdc is shown as a positive electrode active material resistance Ra1, a negative electrode active material resistance Ra2, a positive electrode collecting foil resistance Rb1, a negative electrode collecting foil resistance Rb2 and an electrolyte resistance R3 of the separator 128.

The reaction resistance Rc is an impedance component relevant to transfer (electric charge movement) of an electric charge on an interface (a surface of a positive electrode active material or a negative electrode active material) between the electrolyte and the active material. The reaction resistance Rc increases due to advance in lithium deposition on the negative electrode 127. Further, the reaction resistance Rc can increase, for example, due to growth of a film on the interface between the active material and the electrolyte when the battery 10 having a high SOC is under a high-temperature environment. In the equivalent circuit diagram, the reaction resistance Rc is shown as a positive electrode reaction resistance Rc1 and a negative electrode reaction resistance Rc2. Here, SOC is a state of charge of the battery 10.

The diffusion resistance Rd is an impedance relevant to diffusion of an ion in the electrolyte or diffusion of an electric charge transport substance in the active material. The diffusion resistance Rd increases, for example, due to active material cracking when a high load is applied. The diffusion resistance Rd is determined by a balanced voltage Veq1 to be generated in the positive electrode 126, a balanced voltage Veq2 to be generated in the negative electrode 127, and a salt concentration overvoltage Vov3 (an overvoltage caused by generation of a salt concentration distribution of the active material in the separator 128) to be generated in the cell 12.

Thus, an impedance Z of the battery 10 includes various impedance components. In the embodiment, the reaction resistance Rc is estimated while the reaction resistance Rc is separated from the other impedance components. This process is referred to as a "deterioration state estimation process", and will be described below in detail.

Deterioration State Estimation Process

A response time to a change in the current IB is different for each impedance component. An impedance component in which the response time is relatively short can follow the change in the current IB with a short period (that is, at a high frequency). On the other hand, an impedance component in which the response time is relatively long cannot follow the change in the current IB with a short period.

Based in this knowledge, in the embodiment, for example, at the time of stop of the vehicle 1 or at the time of a steady traveling (at the time when the battery 10 outputs a constant current), the consumption current of the compressor (not illustrated) of the air conditioner 60 is varied, such that the current IB of the battery 10 is varied with different periods. Thereby, current patterns in each of which a ripple current is superimposed on a constant current (base current) are generated. Then, voltage responses (voltage VB) when the current patterns are applied are detected by the voltage sensor 21.

As the generation technique for the current pattern, it is allowable to employ a control other than the control to vary the consumption current of the compressor of the air conditioner 60. Specifically, the ECU 100 may control the PCU 30 at the time of the steady traveling of the vehicle 1, so as to vary a d-axis current (a current that does not generate torque) of the motor generator 72. Further, the ECU 100 may control the charging device 50 so as to vary a charging current to be input to the battery 10 at the time of the plug-in charge of the vehicle 1.

Figure 5A:
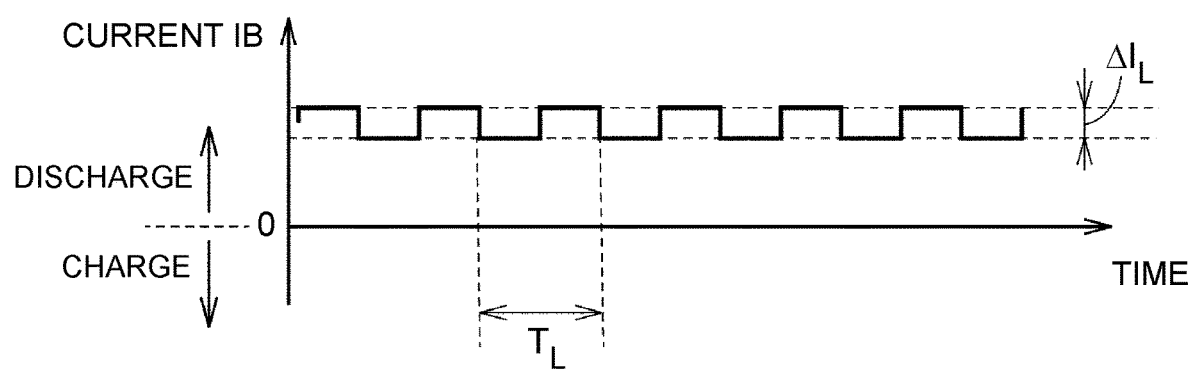
FIG. 5A and FIG. 5B are diagrams showing exemplary current patterns in the embodiment.
Figure 5B:
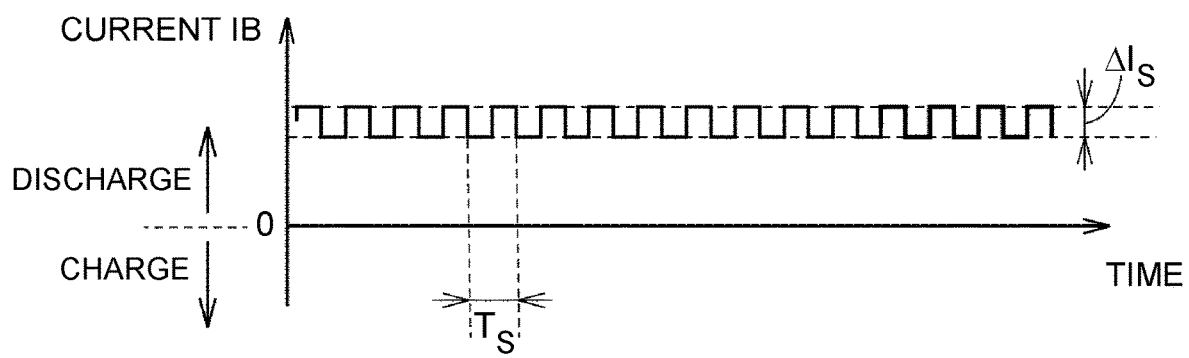

FIG. 5A and FIG. 5B are diagrams showing exemplary current patterns in the embodiment. In each of FIG. 5A and FIG. 5B, the abscissa axis indicates an elapsed time of application of the current pattern, and the ordinate axis indicates the current IB. Each of FIG. 5A and FIG. 5B shows the current pattern during the discharge of the battery 10, but the directions of the charge and discharge of the battery 10 are not limited to the directions shown in FIG. 5A and FIG. 5B.

Hereinafter, "L" is put to parameters about the application of a current pattern with a long period (first period), and "S" is put to parameters about the application of a current pattern with a short period (second period). In the case of not discriminating between the long period and the short period, neither "L" nor "S" is put.

FIG. 5A shows an exemplary current pattern with a long period $T_L$. When the current pattern with the long period $T_L$ is applied, the variation amount of the current IB on the basis of the current value of the base current is represented as $\Delta I_L$, the variation amount of an electromotive force Vo in connection with the current variation is represented as $\Delta Vo$, and the variation amount of the voltage VB in connection with the current variation is represented as $\Delta V_L$. Further, the impedance to be calculated when the current pattern has the long period $T_L$ is referred to as a "long-period impedance $Z_L$". The relation of Expression (1) is satisfied among the voltage variation amount $\Delta V_L$, the current variation amount $\Delta I_L$ and the long-period impedance $Z_L$. The magnitude of the current variation amount $\Delta I_L$ can be set to about 1% of the magnitude of the base current.

$$\Delta V_L = \Delta Vo - Z_L \times \Delta I_L \tag{1}$$

When the long period $T_L$ is relatively short in Expression (1), the electromotive force variation amount $\Delta Vo$ can be regarded as the electromotive force variation amount $\Delta Vo \approx 0$. Therefore, Expression (1) is transformed as shown in Expression (2).

$$Z_L = -\Delta V_L / \Delta I_L \tag{2}$$

Thus, in the embodiment, the current pattern with the long period $T_L$ is applied to the battery 10, and the voltage variation amount $\Delta V_L$ at this time is detected by the voltage sensor 21. Then, the long-period impedance $Z_L$ is calculated from the ratio of the voltage variation amount $\Delta V_L$ and the current variation amount $\Delta I_L$.

The same goes for the application of the current pattern with the short period, although detailed descriptions are not repeated. FIG. 5B shows an exemplary current pattern with a short period $T_S$. Similarly, a "short-period impedance $Z_S$" can be calculated from Expression (3), by applying the current pattern with the short period $T_S$.

$$Z_S = -\Delta V_S/\Delta I_S \quad (3)$$

After the long-period impedance $Z_L$ and the short-period impedance $Z_S$ are sequentially calculated (the calculation order does not matter), the difference $\Delta Z = Z_L - Z_S$ between the long-period impedance $Z_L$ and the short-period impedance $Z_S$ is calculated in the embodiment. As understood from the following description, the difference $\Delta Z$ is an impedance component corresponding to a reaction resistance Rc of the battery 10.

Figure 6A:
FIG. 6A, FIG. 6B and FIG. 6C are diagrams showing equivalent circuits of the battery for a long period and a short period.
Figure 6B:
Figure 6C:

FIG. 6A, FIG. 6B and FIG. 6C are diagrams showing equivalent circuits of the battery 10 for the long period $T_L$ and the short period $T_S$. FIG. 6A, FIG. 6B and FIG. 6C show how the equivalent circuit diagram shown in FIG. 4 changes when the current patterns are applied. FIG. 6A shows an equivalent circuit diagram for the long period $T_L$, and FIG. 6B shows an equivalent circuit diagram for the short period $T_S$.

Even the impedance component in which the response time is relatively long can follow the change with the long period $T_L$ in the current pattern. Therefore, the long-period impedance $Z_L$ includes all impedance components. Specifically, as shown in FIG. 6A, the long-period impedance $Z_L$ includes the active material resistance Ra (the positive electrode active material resistance Ra1 and the negative electrode active material resistance Ra2), the collecting foil resistance Rb (the positive electrode collecting foil resistance Rb1 and the negative electrode collecting foil resistance Rb2), the reaction resistance Rc (the positive electrode reaction resistance Rc1 and the negative electrode reaction resistance Rc2), and the electrolyte resistance R3.

In contrast, the impedance component in which the response time is relatively long cannot follow the change with the short period $T_S$ in the current pattern. To explain in more detail, the equivalent circuit diagram shown in FIG. 4 shows a positive electrode capacity C1 connected in parallel to the positive electrode reaction resistance Rc1 and a negative electrode capacity C2 connected in parallel to the negative electrode reaction resistance Rc2, as electric double layers. At the time of the current variation (at the time of current increase or at the time of current decrease), a current corresponding to the variation flows through the positive electrode capacity C1 and the negative electrode capacity C2, and therefore, does not flow through the reaction resistance Rc. Therefore, the voltage variation amount $\Delta V_S$ for the short period $T_S$ does not include the component of the reaction resistance Rc (the positive electrode reaction resistance Rc1 and the negative electrode reaction resistance Rc2). Accordingly, the short-period impedance $Z_S$ includes the active material resistance Ra and the collecting foil resistance Rb, but does not include the reaction resistance Rc (see FIG. 6B).

Therefore, as shown in FIG. 6C, the reaction resistance Rc can be evaluated from the difference $\Delta Z$ between the long-period impedance $Z_L$ and the short-period impedance $Z_S$. By evaluating the reaction resistance Rc, as described above, it is possible to exactly predict the degree of the lithium deposition in the battery 10 (or the degree of change in tolerance of the battery 10 for the lithium deposition).

The short-period impedance $Z_S$ includes the active material resistance Ra, the collecting foil resistance Rb and the electrolyte resistance R3. The active material resistance Ra and the collecting foil resistance Rb are hard to increase even when the battery 10 deteriorates. Therefore, increase in the short-period impedance Zs is mainly due to increase in the electrolyte resistance R3. Generally, the increase in the electrolyte resistance in the lithium-ion secondary battery is often a deterioration (a so-called high-rate deterioration) caused by a biased lithium-ion concentration distribution in the electrolyte. Therefore, by evaluating the increase amount of the short-period impedance $Z_S$, it is possible to estimate the degree of the high-rate deterioration at a high accuracy.

On the other hand, the long-period impedance $Z_L$ includes all impedance components, and therefore, it is possible to calculate parameters relevant to the impedance of the whole of the battery 10, from the long-period impedance $Z_L$. Specifically, it is possible to suitably calculate an allowable charging power Win indicating a control upper limit of the charging power of the battery 10 and an allowable discharging power Wout indicating a control upper limit of the discharging power of the battery 10, from the long-period impedance $Z_L$.

Determination of Period.

The lengths of the long period $T_L$ and the short period $T_S$ can be determined in advance, by executing an alternating-current impedance measurement described below, to the battery 10.

Figure 7:
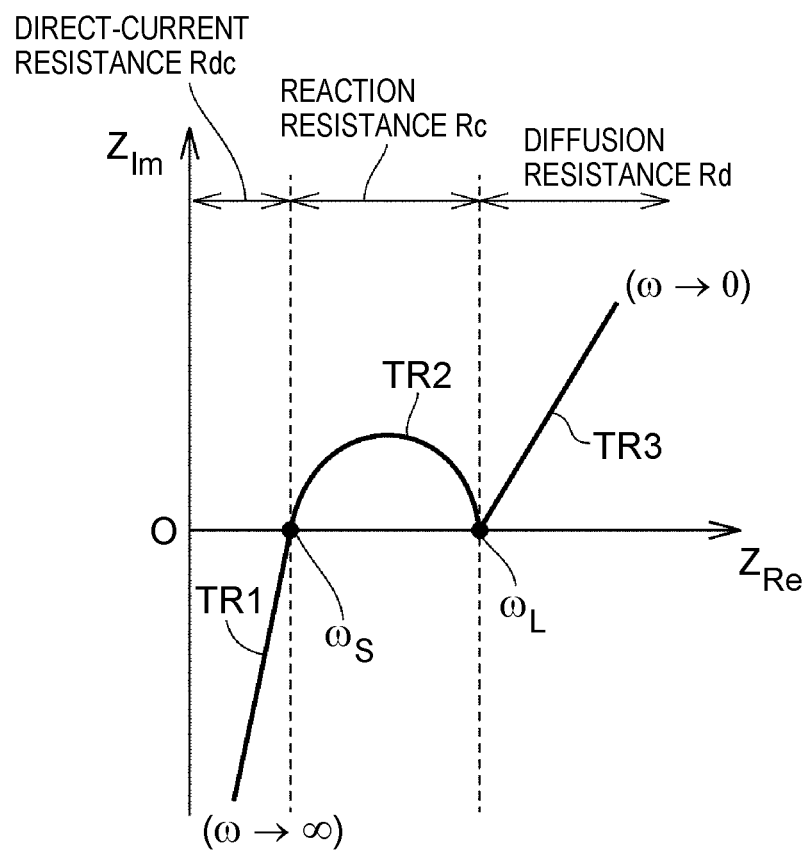
FIG. 7 is a complex impedance plot showing an alternating-current impedance measurement result for determining the long period and the short period.

FIG. 7 is a complex impedance plot (also called a Nyquist plot) showing an alternating-current impedance measurement result for determining the long period $T_L$ and the short period $T_S$. In FIG. 7, the abscissa axis indicates a real number component $Z_{Re}$ (resistance component) of the complex impedance of the battery 10. The ordinate axis indicates an imaginary number component $Z_{Im}$ (capacity component) of the complex impedance of the battery 10.

In the alternating-current impedance measurement, for example, an angular frequency ω is swept in a range of 10 mHz to 100 kHz, and a linear locus TR1, a semicircular locus TR2 and a linear locus TR3 are obtained. In the loci TR1 to TR3 plotted in the figure, the angular frequency ω increases in the leftward direction in the figure. The locus TR1 in a high frequency region reflects the direct-current resistance Rdc of the battery 10. The locus TR2 in an intermediate region reflects the reaction resistance Rc of the battery 10. The locus TR3 in a low frequency region reflects the diffusion resistance Rd of the battery 10.

The short period Ts of the current pattern to be applied to the battery 10 can be calculated as a period ($=2\pi/\omega_S$) corresponding to an angular frequency $\omega_S$ at an end point on the low frequency side of the semicircular locus TR2. For example, the short period $T_S$ is a short period on the order of milliseconds (a period corresponding to a frequency range of about 1 kHz). On the other hand, the long period $T_L$ of the current pattern can be calculated as a period ($=2\pi/\omega_L$) corresponding to an angular frequency $\omega_L$ at an end point on the high frequency side of the locus TR2. For example, the long period $T_L$ is a period on the order of seconds (that is, a period corresponding to a frequency range of about 1 Hz).

Generally, the alternating-current impedance measurement value of the secondary battery indicates temperature dependence and SOC dependence. Accordingly, it is desired to execute the alternating-current impedance measurement described with FIG. 7 under various measurement conditions, and to prepare a map (a function or a relational expression may be adopted) specifying a relation between the long period $T_L$ and the temperature TB and SOC of the battery 10 in advance. By referring to the map, it is possible to evaluate the long period $T_L$ from the temperature TB and SOC of the battery 10. The same goes for the short period $T_S$.

Electromotive Force of Battery

It has been described that the variation amount ΔVo of the electromotive force Vo when the current pattern is applied can be regarded as ΔVo≈0 in the transformation from Expression (1) to Expressions (2), (3) if the periods ($T_L$, $T_S$) of the current pattern are sufficiently short. However, as described below, depending on state or use manner of the battery 10, ΔVo cannot be approximated by ΔVo≈0 because the electromotive force Vo of the battery 10 changes when the current IB is being varied.

Figure 8A:
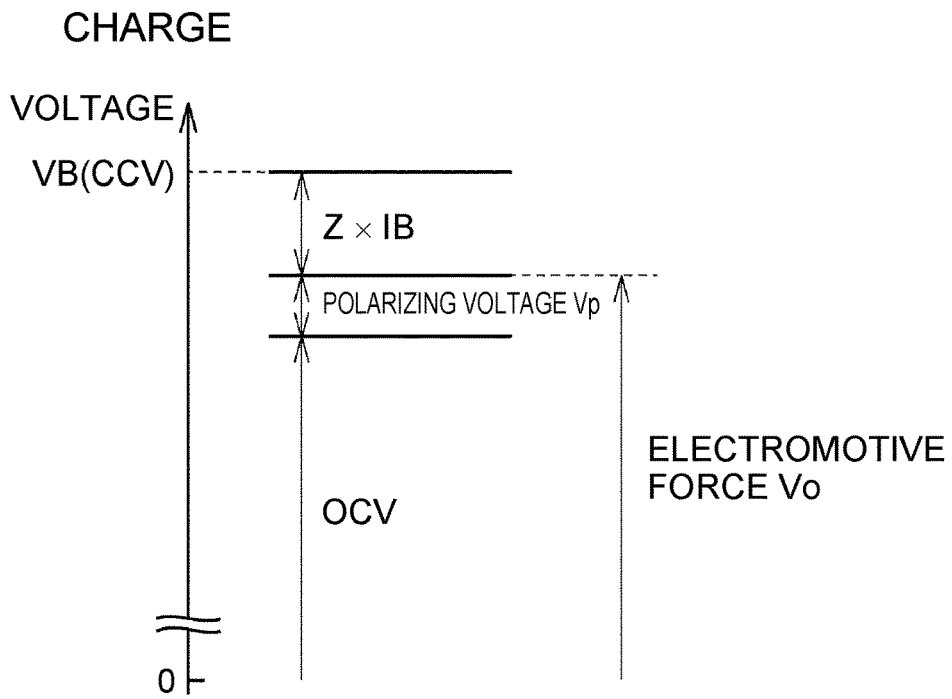
FIG. 8A and FIG. 8B are diagrams for describing the voltage of the battery.
Figure 8B:
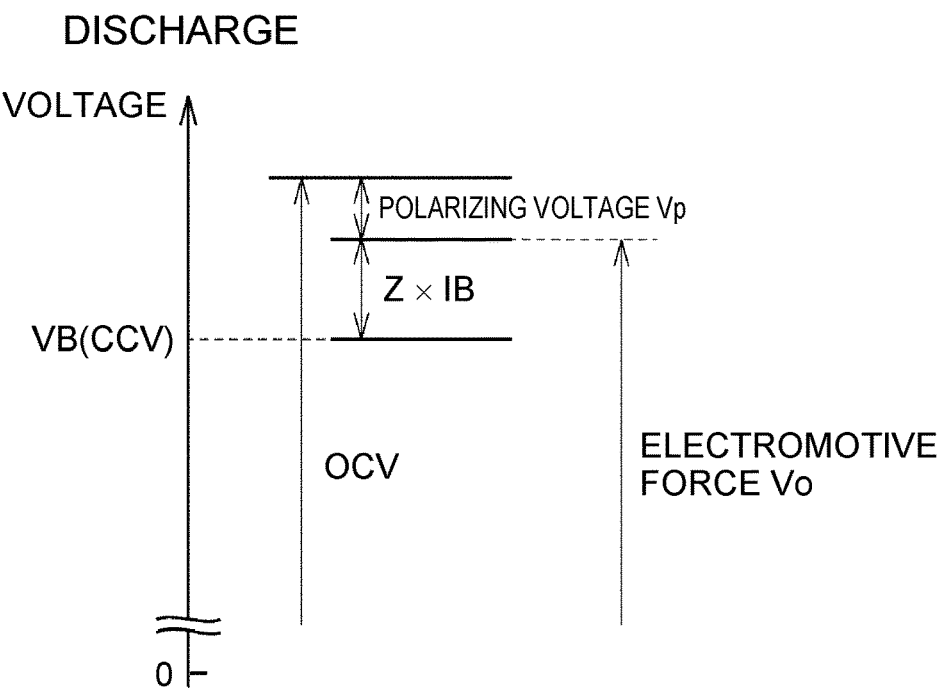

FIG. 8A and FIG. 8B are diagrams for describing the voltage of the battery 10. FIG. 8A shows voltage components of the battery 10 at the time of the charge, and FIG. 8B shows voltage components of the battery 10 at the time of the discharge.

With reference to FIG. 8A and FIG. 8B, the voltage VB of the battery 10 is the closed circuit voltage (CCV) that is detected by the voltage sensor 21. The voltage VB is expressed as the sum of the electromotive force Vo of the battery 10 and a voltage drop amount (Z×IB) in connection with the charge or discharge (the input or output of the current IB) of the battery 10. Furthermore, the electromotive force Vo is defined as the sum of the open circuit voltage (OCV) and polarizing voltage Vp of the battery 10, as shown in Expression (4).

$$Vo = OCV - Vp \quad (4)$$

In the present specification, the polarizing voltage Vp means a voltage component that is generated due to a biased distribution of lithium (and lithium ion) in the active material and electrolyte of the battery 10. On the other hand, the OCV means a voltage component after time has elapsed since the finish of the charge or discharge of the battery 10 (since the start of the leaving) and the polarization of the battery 10 has been sufficiently relaxed. There is a correlation (OCV-SOC curve) between the OCV and the SOC. While the electromotive force Vo of the battery 10 is divided into the two voltage components in this way, change in each voltage component will be discussed.

As the current IB to be received or output by the battery 10 becomes larger, the biased distribution of lithium in the active material and the electrolyte is generated more easily, and therefore, the change amount of the polarizing voltage Vp becomes larger. Further, generally, as the temperature of the secondary battery becomes lower, the magnitude (absolute value) of the polarizing voltage becomes larger. Therefore, the change amount of the polarizing voltage Vp in connection with the current variation becomes large, even when the battery 10 is under a low-temperature environment. Thus, the change amount of the electromotive force Vo becomes large, when the change amount of the polarizing voltage Vp becomes large due to a large current or a low-temperature environment.

Furthermore, as understood from a typical OCV-SOC curve (not illustrated), when the SOC of the battery 10 gets to be contained in a low-SOC region with the discharge of the battery 10, the slope of the OCV-SOC curve (the OCV change amount per unit SOC change amount) becomes sharper than when the SOC is contained in a SOC region (flat SOC region) in which the SOC is a middle level. Therefore, there is a possibility that the OCV change amount in connection with the current variation becomes relatively large even when the SOC change amount in connection with the current variation is relatively small. When the OCV change amount becomes large, the change amount of the electromotive force Vo also becomes large.

Thus, depending on the current IB, temperature TB or SOC of the battery 10, there is a possibility that the change amount of the voltage component (the OCV or the polarizing voltage Vp) of the electromotive force Vo becomes a non-negligible amount even in a time shorter than the period of the variation in the current IB. For example, when the electromotive force Vo changes while the current IB is being varied with the long period $T_L$, an error in connection with the approximation from Expression (1) to Expression (2) increases, so that the long-period Impedance $Z_L$ cannot be exactly calculated. As a result, the estimation accuracy of the reaction resistance Rc can decrease. When the estimation accuracy of the reaction resistance Rc decreases, there is a possibility that the deterioration mode (that is, the degree of the lithium deposition) corresponding to the reaction resistance Rc cannot be also estimated at a high accuracy.

Hence, in order to remove the influence of the change in the electromotive force Vo (the change in the OCV and the change in the polarizing voltage Vp), the embodiment employs a configuration of acquiring the voltage VB (CCV) of the battery 10 with the voltage sensor 21 and performing a predetermined computation process to the acquired voltage VB, three times in all, whenever half of the period of the current pattern elapses. The computation process will be described below in detail.

Computation Process for Removing Influence of Electromotive Force Change

Figure 9:
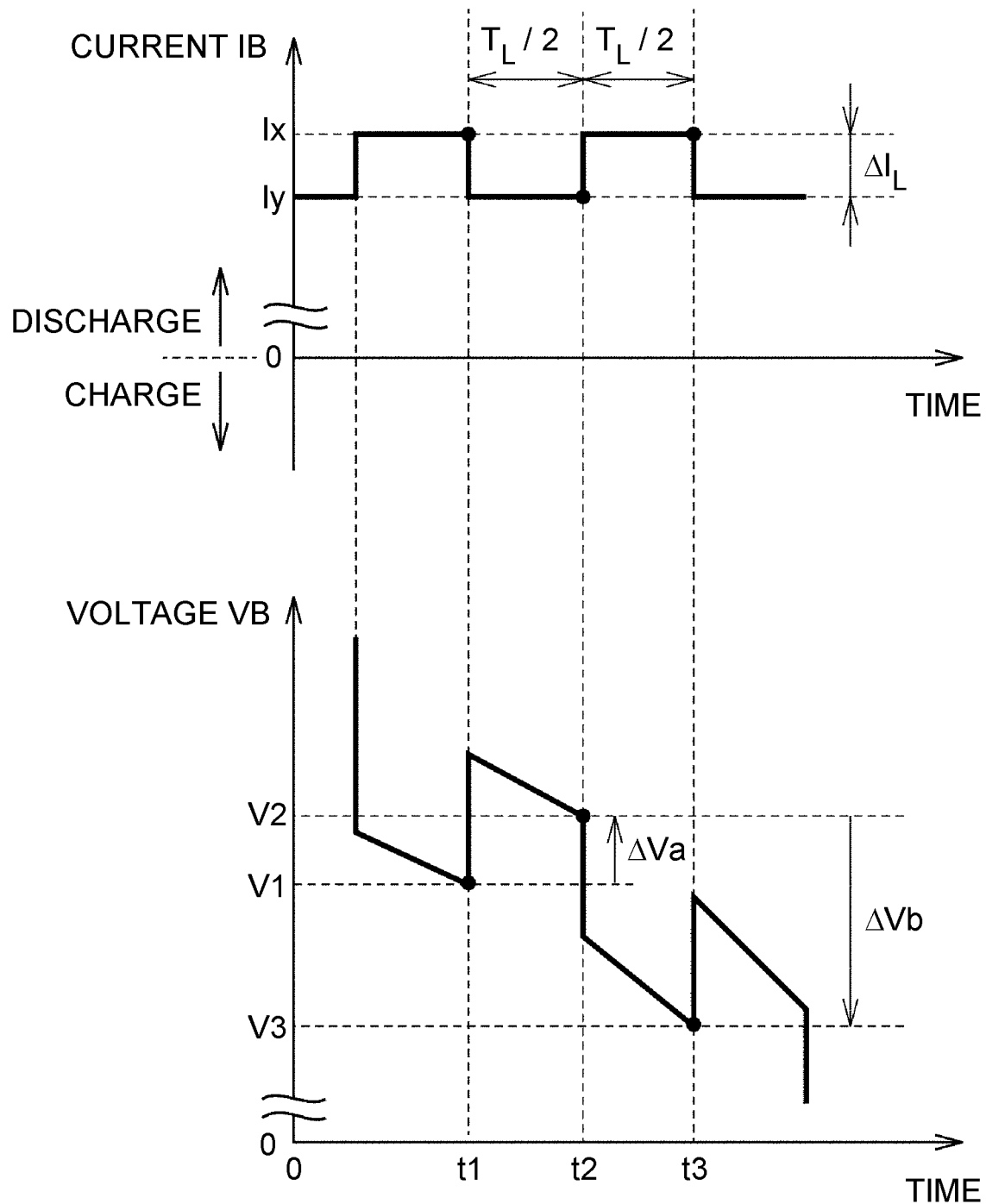
FIG. 9 is a diagram for describing an impedance calculation technique in the embodiment.

FIG. 9 is a diagram for describing an impedance calculation technique in the embodiment. Here, suppose that the current IB is periodically varied between two current values (Ix, Iy) as shown in an upper part of FIG. 9. A lower part of FIG. 9 is an enlarged diagram schematically showing a temporal change in the voltage VB when the current IB is varied with the long period $T_L$.

The voltage VB (=V1) at time t1 (more specifically, at a time just before the current IB changes from Ix to Iy) is expressed as Expression (5), with use of an open circuit voltage OCV1, a polarizing voltage Vp1 and a voltage drop amount ($Z_L$×Ix).

$$V1 = OCV1 - Vp1 - Z_L \times Ix \quad (5)$$

Similarly, at time t2 when half (=$T_L$/2) of the period has elapsed since time t1 (at a time just before the current IB changes from Iy to Ix), the voltage VB (=V2) is expressed as Expression (6), with use of an open circuit voltage OCV2, a polarizing voltage Vp2 and a voltage drop amount ($Z_L$×Iy).

$$V2 = OCV2 - Vp2 - Z_L \times Iy \quad (6)$$

When the difference between OCV1 and OCV2 is referred to as ΔOCVa (=OCV1−OCV2), the open circuit voltage OCV2 is expressed as OCV2=OCV1−ΔOCVa. Further, when the difference between Vp1 and Vp2 is referred to as ΔVpa (=Vp1−Vp2), the polarizing voltage Vp2 is expressed as Vp2=Vp1−ΔVpa. Therefore, Expression (6) is transformed into Expression (7).

$$V2 = (OCV1 - \Delta OCVa) - (Vp1 - \Delta Vpa) - Z_L \times Iy \quad (7)$$

At time t3 when half of the period has further elapsed since time t2 (at a time just before the current IB changes from Ix to Iy), the voltage VB (=V3) is expressed as Expression (8), with use of an open circuit voltage OCV3, a polarizing voltage Vp3 and a voltage drop amount ($Z_L \times Ix$).

$$V3 = OCV3 - Vp3 - Z_L \times Ix \quad (8)$$

For Expression (8), the same expression transformation as the expression transformation from Expression (6) to Expression (7) can be performed. When the difference between OCV2 and OCV3 is referred to ΔOCVb (=OCV2−OCV3), the open circuit voltage OCV3 is expressed as OCV3=OCV2−ΔOCVb=OCV1−ΔOCVa−ΔOCVb. Further, when the difference between Vp2 and Vp3 is referred to as ΔVpb (=Vp2−Vp3), Vp3 is expressed as Vp3=Vp2−ΔVpb=Vp1−ΔVpa−ΔVpb. Therefore, Expression (8) is transformed into Expression (9).

$$V3 = (OCV1 - \Delta OCVa - \Delta OCVb) - (Vp1 - \Delta Vpa - \Delta Vpb) - Z_L \times Ix \quad (9)$$

The voltages VB at time t2 and time t3 are expressed as Expression (7) and Expression (9), with use of the OCV change amount (ΔOCVa, ΔOCVb) and the polarizing voltage change amount (ΔVpa, ΔVpb), and then, the change amount in the voltage VB is calculated. When the difference between the voltage VB (=V1) at time t1 and the voltage VB (=V2) at time t2 is referred to as ΔVa (=V2−V1), ΔVa is expressed as Expression (10) from Expression (5) and Expression (7).

$$\Delta Va = -\Delta OCVa + \Delta Vpa - Z_L \times (Iy - Ix) \quad (10)$$

Similarly, ΔVb (=V3−V2), which is the difference between the voltage V2 at time t2 and the voltage V3 at time t3, is expressed as Expression (11), from Expression (6) and Expression (9).

$$\Delta Vb = -\Delta OCVb + \Delta Vpb + Z_L \times (Iy - Ix) \quad (11)$$

For Expression (11) and Expression (10), the difference between the left-hand sides is taken, and the difference between the right-hand sides is taken, so that Expression (12) is obtained.

$$\Delta Vb - \Delta Va = (-\Delta OCVb + \Delta OCVa) + (\Delta Vpb - \Delta Vpa) + 2Z_L \times (Iy - Ix) \quad (12)$$

In the situation exemplified in FIG. 9, the time between time t1 and time t2 and the time between time t2 and time t3 are equal to each other, and the time is half ($T_L/2$) of the long period $T_L$. Half of the long period $T_L$ is not too short for the open circuit voltage OCV to change (for the change amount of the open circuit voltage OCV to be approximated by ΔOCVa≈0 and ΔOCVb≈0). However, half of the long period $T_L$ is so short that the change in the open circuit voltage OCV of the battery 10 can be approximated by a linear change.

Furthermore, the current IB is a current in which the ripple current is superimposed on the base current. The magnitude of the ripple current is sufficiently small, and for example, is about 1% of the magnitude of the base current. Therefore, in the example shown in FIG. 9, the battery 10 is discharged at a constant speed, and the speed of the SOC decrease until one period of the long period $T_L$ elapses (after time t1 and before time t3) can be regarded as being nearly constant. In consideration of the OCV-SOC curve, when the speed of the SOC decrease is constant, the speed of OCV decrease can be regarded as being nearly constant. Accordingly, the magnitude of the OCV change amount in the former half (a time after time t1 and before time t2, hereinafter referred to as "former-half period") of one period of the long period $T_L$ is nearly equal to the magnitude of the OCV change amount in the latter half (a time after time t2 and before time t3, hereinafter referred to as "latter-half period") of one period of the long period $T_L$. That is, for the magnitude of the change amount ΔOCVa of the open circuit voltage OCV and the magnitude of the change amount ΔOCVb of the open circuit voltage OCV, an approximation of |ΔOCVa|≈|ΔOCVb| is possible. At the first member on the right-hand side of Expression (12), the sign of ΔOCVa is opposite to the sign of ΔOCVb, and therefore, an approximation of −ΔOCVb+ΔOCVa≈0 is possible.

Although detailed descriptions are not repeated, the same goes for the change amount of the polarizing voltage Vp, and an approximation of |ΔVp|≈|ΔVpb| is possible because the magnitude of the ripple current is sufficiently smaller than the magnitude of the base current. Therefore, the second member on the right-hand side of Expression (12) is approximated by ΔVpb−ΔVpa≈0. Therefore, Expression (13) is derived from Expression (12).

$$\Delta Vb = \Delta Va = 2Z_L \times (Iy - Ix) \quad (13)$$

When the voltage difference ΔVb (=V3−V2) and voltage difference ΔVa (=V2−V1) on the left-hand side of Expression (13) are expressed with the voltages V1 to V3 again, the long-period impedance $Z_L$ of the battery 10 is expressed as Expression (14).

$$Z_L = \{(V3 - V2) - (V2 - V1)\} / \{2 \times (Iy - Ix)\} \quad (14)$$

In Expression (14), the voltages V1 to V3 are detection values of the voltage sensor 21, and the currents Ix, Iy are detection values of the current sensor 22. Accordingly, from Expression (14), it is found that the long-period impedance $Z_L$ can be calculated based on detection values (actual measurement values) of the sensors provided in the battery 10.

Thus, with the embodiment, the ripple current having the long period $T_L$ is superimposed on the base current, and the voltage VB (V1 to V3) is acquired by the voltage sensor 21, at a time point (time t1) of the variation period of the ripple current, at a time point (time t2) when half of the period has elapsed since time t1 and at a time point (time t3) when half of the period has further elapsed since time t2. The voltage VB, which is the CCV, is divided into the open circuit voltage OCV, the polarizing voltage Vp and the voltage drop amount in connection with the charge and discharge of the battery 10, and the difference between the change amount (ΔVa) of the voltage VB in the former-half period and the voltage change amount (ΔVb) in the latter-half period is taken. As a result, the OCV change amount (ΔOCVa) in the former-half period and the OCV change amount (ΔOCVb) in the latter-half period are cancelled out, and the change amount (ΔVpa) of the polarizing voltage Vp in the former-half period and the change amount (ΔVpb) of the polarizing voltage Vp in the latter-half period are cancelled out. That is, the influence of the OCV change and polarizing voltage change in connection with the current variation on the long-period impedance $Z_L$ is removed. As a result, the approximation expression (14) including only the parameters that can be measured by the voltage sensor 21 and the current sensor 22 is satisfied. Thereby, even when a condition of the change in the electromotive force Vo of the battery 10 (a condition such as a large current, a low temperature or a low SOC) is satisfied while the ripple current is superimposed, it is possible to calculate the long-period impedance $Z_L$ at a high accuracy.

In the example described with FIG. 9, the variation period of the current IB is the long period $T_L$. Also in the case where the variation period of the current IB is the short period $T_S$, a similar computation is performed, so that the short-period impedance $Z_S$ can be calculated. Then, the reaction resistance Rc of the battery 10 can be estimated based on the difference between the long-period impedance $Z_L$ and the short-period impedance $Z_S$ (see FIG. 6A, FIG. 6B, and FIG. 6C).

The state of the current IB=Ix corresponds to an initial phase, and the state of the current IB=Iy corresponds to an opposite phase. Therefore, half of the period from time t1 to time t2 corresponds to "a period in which the phase of the current IB is inverted from the initial phase to the opposite phase", and ΔVa during that time corresponds to the "change amount of the detection value of the voltage sensor 21 in a period in which the phase of the current IB is inverted from the initial phase to the opposite phase". Further, half of the period from time t2 to time t3 corresponds to "a period in which the phase of the current IB is returned from the opposite phase to a phase equal to the initial phase", and ΔVb during that time corresponds to the "change amount of the detection value of the voltage sensor 21 in a period in which the phase of the current IB is returned from the opposite phase to the phase equal to the initial phase". Further, (Iy−Ix) corresponds to the "change amount of the current IB in a period in which of the phase of the current IB inverted from the initial phase to the opposite phase".

Deterioration State Estimation Flow

Figure 10:
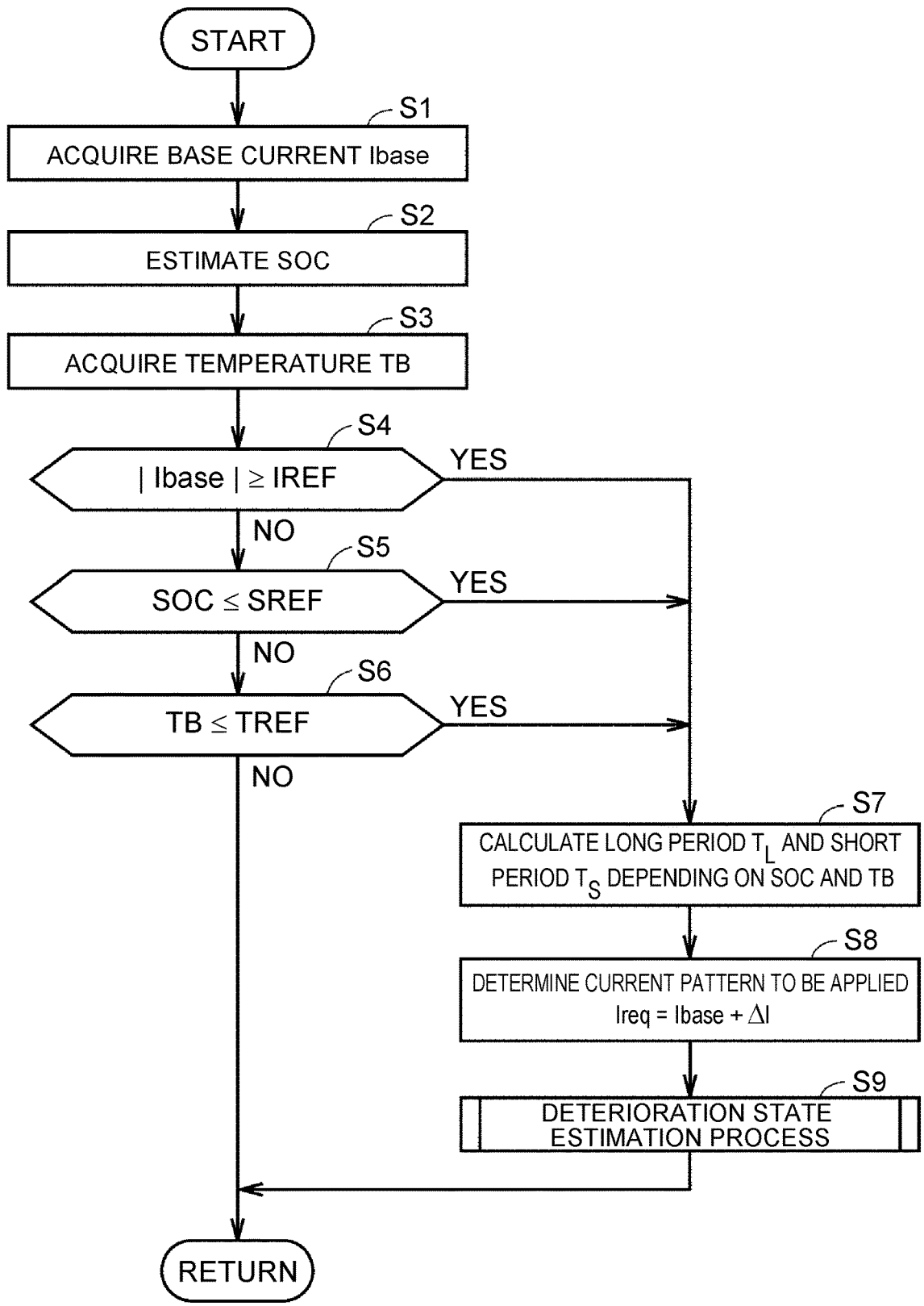
FIG. 10 is a flowchart for describing an overall flow of a process for estimating a reaction resistance of the battery in the embodiment.

FIG. 10 is a flowchart for describing an overall flow of a process for estimating the deterioration state of the battery 10 in the embodiment. The flowchart is called from an unillustrated main routine and is executed, in the case of satisfaction of a condition that a periodic current pattern can be applied (more specifically, a condition that the base current is constant, for example, due to the stop of the vehicle 1 (including the stop for the plug-in charge) or the steady traveling, and that the PCU 30, the charging device 50 and the air conditioner 60 can be controlled for superimposing the ripple current on the base current). Each step (abbreviated to S) is basically realized through software processing by the ECU 100, but may be realized through hardware processing by electronic circuits created in the ECU 100.

With reference to FIG. 10, in S1, the ECU 100 acquires a current (base current) Ibase to be received or output by the battery 10, from the current sensor 22. In S2, the ECU 100 estimates the SOC of the battery 10. As the SOC estimation technique, various known techniques such as a technique of referring to the OCV-SOC curve or a technique based on current integration can be used. Furthermore, the ECU 100 acquires the temperature TB of the battery 10, from the temperature sensor 23 (S3). The order of the processes of S1 to S3 may be appropriately modified.

In the following S4 to S6, the ECU 100 determines whether conditions suitable for execution of the deterioration state estimation process (S9) in the embodiment have been satisfied. Specifically, in S4, the ECU 100 determines whether the magnitude of the base current Ibase is equal to or larger than a predetermined reference value IREF. Further, in S5, the ECU 100 determines whether the SOC estimated in S2 is equal to or lower than a predetermined reference level SREF. Furthermore, in S6, the ECU 100 determines whether the temperature TB of the battery 10 acquired in S3 is equal to or lower than a reference temperature TREF.

The reference value IREF of the base current Ibase is a current value (for example, a few hundred A) at which a biased distribution of lithium in the active material and the electrolyte is easily generated. The reference level SREF of the SOC is a SOC (for example, about 20%) at which the slope of the OCV-SOC curve becomes sharp. Further, the reference temperature TREF of the temperature TB is a temperature (for example, below freezing) at which the polarizing voltage Vp becomes conspicuously high. Parameters as these references may be appropriately determined based on the specification of the battery 10, or may be determined by experiments depending on measurement results of the characteristics of the battery 10.

In the case where none of the conditions in S4 to S6 is satisfied (NO in S4 and NO in S5 and NO in S6), the ECU 100 returns the process to RETURN. On the other hand, in the case where at least one of the conditions in S4 to S6 is satisfied (YES in S4, YES in S5 or YES in S6), the ECU 100 transfers the process to S7, and calculates the long period $T_L$ and the short period $T_S$ from the SOC and temperature TB of the battery 10. The calculation technique has been described in detail with FIG. 7, and therefore, the description is omitted.

In S8, the ECU 100 determines the current pattern to be applied to the battery 10. In the current pattern, the ripple current is superimposed on the constant base current Ibase. The amplitude (ΔI) of the ripple current is determined to a magnitude (for example, a few mA to a few hundred mA) suitable for the calculation of the long-period impedance $Z_L$ and the short-period impedance $Z_S$, by previous experiments or simulations. Thereafter, the ECU 100 transfers the process to S9, and executes the deterioration state estimation process.

In the above description, in the case where none of the conditions in S4 to S6 is satisfied, the ECU 100 returns the process to RETURN. However, the ECU 100 may execute an ordinary deterioration state estimation process (that is, a process of calculating the long-period impedance $Z_L$ at one time point during the application of a voltage pattern having the long period $T_L$, calculating the short-period impedance $Z_S$ at another time point during the application of a voltage pattern having the short period $T_S$, and taking the difference between these impedances). Further, even in the case where none of the conditions in S4 to S6 is satisfied, the ECU 100 may execute the deterioration state estimation process (S9) in the embodiment, although the deterioration state estimation process (S9) in the embodiment requires a longer processing time than the ordinary deterioration state estimation process.

Figure 11:
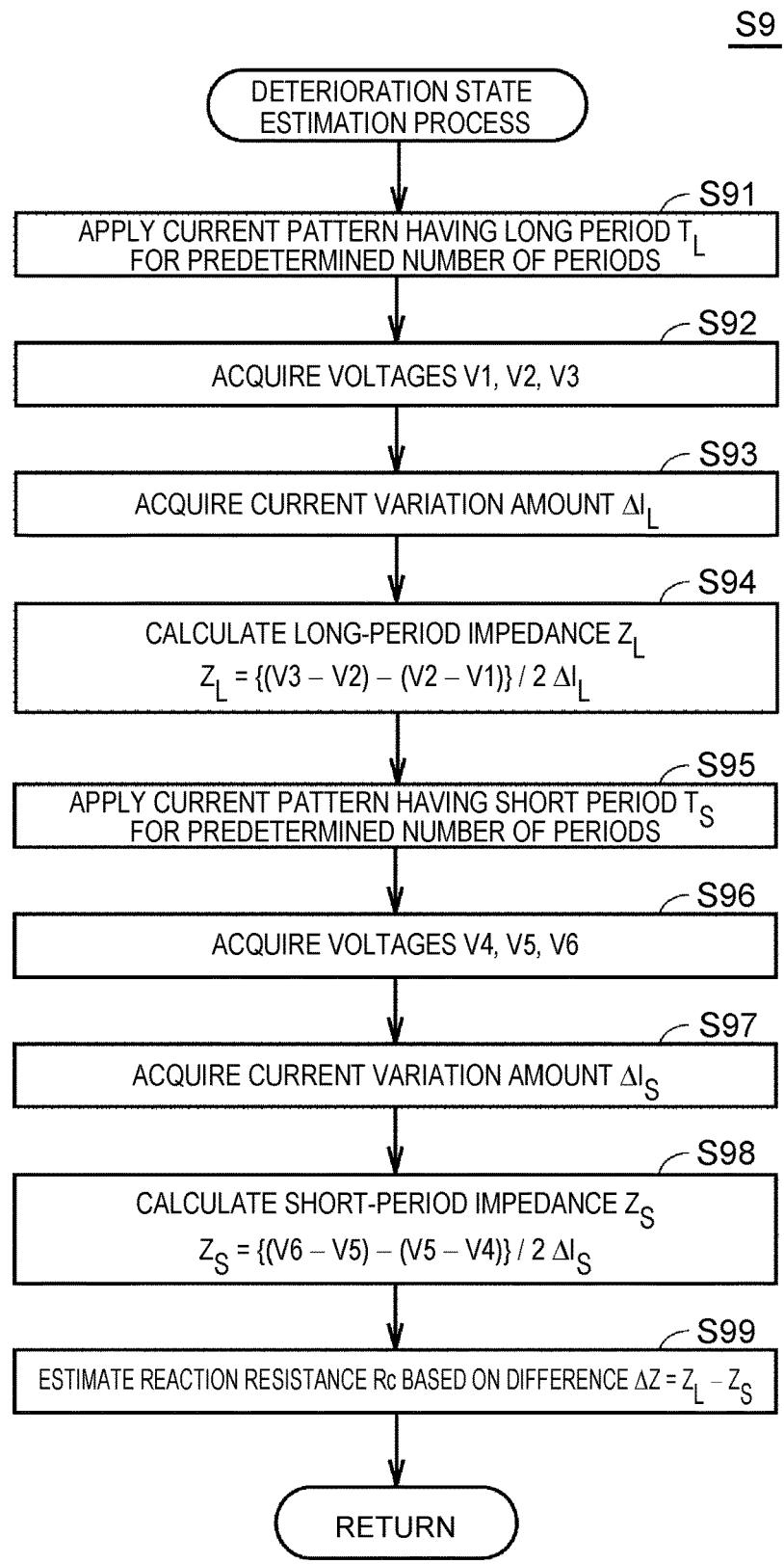
FIG. 11 is a flowchart for describing a deterioration state estimation process shown in FIG. 10 in detail.

FIG. 11 is a flowchart for describing the deterioration state estimation process (S9) shown in FIG. 10, in detail. With reference to FIG. 11, in S91, to the battery 10, the ECU 100 applies the current pattern having the long period $T_L$, for a predetermined number of (two or more) periods (the predetermined number is the number of repetitions of the current waveform).

Then, the ECU 100 acquires V1 to V3, each of which is the voltage VB of the battery 10 during the application of the current pattern having the long period $T_L$, from the voltage sensor 21 (S92). As described with FIG. 9, the voltage V1 is the detection value of the voltage sensor 21 in the case of the current IB=Ix at time t1. The voltage V2 is the detection value of the voltage sensor 21 in the case of the current IB=Iy at time t2 when half of the period has elapsed since time t1. The voltage V3 is the detection value of the voltage sensor 21 in the case of the current IB=Ix at time t3 when half of the period has further elapsed since time t2. The voltages V1, V2, and V3 are the examples of the "first detection value", "second detection value", and "third detection value" according to the disclosure, respectively. It is not essential that the current IB is varied in the order of Ix, Iy and Ix at times t1 to t3, and the current IB may be varied oppositely in the order of Iy, Ix and Iy.

In S93, the ECU 100 acquires a current variation amount $\Delta I_L$(=Ix−Iy) in the current pattern having the long period $T_L$. For the current variation amount $\Delta I_L$, the current IB may be detected by the current sensor 22, and the difference between two detection values may be calculated. Alternatively, the specified value of the amplitude of the current pattern determined in the process of S8 in FIG. 10 may be adopted as the current variation amount $\Delta I_L$.

In S94, the ECU 100 calculates the long-period impedance $Z_L$, from the detection results of the voltage VB (V1 to V3) and current IB ($\Delta I_L$) during the application of the current pattern having the long period $T_L$, in accordance with Expression (14).

Similarly, for the short period $T_S$, in S95, the ECU 100 applies the current pattern having the short period $T_S$, to the battery 10, for a predetermined number of periods. Then, the ECU 100 acquires V4 to V6, each of which is the voltage VB of the battery 10 during the application of the current pattern, from the voltage sensor 21 (S96). Furthermore, in S97, the ECU 100 acquires a current variation amount $\Delta I_S$ in the current pattern having the short period $T_S$. The processes of S95 to S97 are basically the same as the processes of S91 to S93 for the long period $T_L$, although there is a difference in the length of the frequency of the current pattern.

In S98, the ECU 100 calculates the short-period impedance $Z_S$, from the detection results of the voltage VB (V4 to V6) and current IB ($\Delta I_S$) during the application of the current pattern having the short period $T_S$, similarly to S94. Then, the ECU 100 estimates the reaction resistance Rc of the battery 10, by calculating the difference $\Delta Z$ between the long-period impedance $Z_L$ and the short-period impedance $Z_S$ (S99). The processes of S91 to S94 correspond to an example of the "first calculation process" in the disclosure, and the processes of S95 to S98 correspond to an example of the "second calculation process" in the disclosure.

Thus, in the embodiment, when the ripple current is superimposed on the base current, the magnitude (|ΔOCVa|) of the OCV change amount in the former-half period of the ripple current is nearly equal to the magnitude (|ΔOCVb|) of the OCV change amount in the latter-half period, and the approximation of |ΔOCVa|≈|ΔOCVb| is performed. The same goes for the change amount of the polarizing voltage Vp. The magnitude (|ΔVpa|) of the change amount of the polarizing voltage in the former-half period is nearly equal to the magnitude (|ΔVpb|) of the change amount of the polarizing voltage in the latter-half period, and the approximation of |ΔVpa|≈|ΔVpb| is performed. Thereby, between the former-half period and the latter-half period, the OCV components are cancelled out and the polarizing voltage components are cancelled out, so that Expression (12) is simplified to Expression (13). Accordingly, as shown in Expression (14), the long-period impedance $Z_L$ of the battery 10 can be expressed with the CCV detected by the voltage sensor 21. In Expression (14), the influence of the change in the electromotive force (the change in the OCV and the polarizing voltage) is removed. Therefore, with no influence of the change in the electromotive force, it is possible to estimate the reaction resistance Rc at a high accuracy, and to estimate the deterioration mode (for example, the degree of the lithium deposition) corresponding to the reaction resistance Rc at a high accuracy.

In the embodiment, the configuration in which the current pattern with a rectangular wave is applied has been described as an example. However, the waveform of the current pattern is not limited to this. For example, the current pattern may be a sine wave, or may be a saw-tooth wave.

However, it is most desirable to employ the current pattern with a rectangular wave, for the following reason.

In the description with FIG. 5A and FIG. 5B, the current IB is varied with a rectangular wave, and the voltage detection by the voltage sensor 21 is performed just before the change in the current IB. In this case, after the change in the current IB and before the elapse of half of the period, the current IB is maintained at a constant value, and therefore, capacity components (the positive electrode capacity C1 and negative electrode capacity C2 shown in FIG. 4) included in the equivalent circuit of the battery 10 are sufficiently charged and discharged. Thereby, in the calculation of the difference between the former-half period and the latter-half period, the difference between a sufficiently charged capacity component and a sufficiently discharged capacity component is calculated, so that the capacity components cancel out each other. As a result, influence of the capacity components of the battery 10 is removed. Therefore, it is possible to further improve the estimation accuracy of the reaction resistance Rc.

Thus, from a standpoint of securement of the time for the charge and discharge of the capacity components, it is preferable that the current IB before the voltage detection be as constant as possible. Therefore, the most desirable wave next to the rectangular wave is the sine wave, among the rectangular wave, the sine wave and the saw-tooth wave. This is because the current IB is nearly constant in the vicinity of the extreme value (the local maximum value or local minimum value) of the sine wave in the case where the current pattern is the sine wave.

However, in the estimation of the reaction resistance Rc according to the disclosure, it is not essential that the current IB before the voltage detection is constant. For example, the voltage VB may be detected just after the change in the current IB, if the voltage VB is detected whenever half of the period of the current pattern elapses. Needless to say, the voltage detection at such a timing is also included in the disclosure.

In the embodiment, the example in which the battery 10 is a lithium-ion secondary battery has been described. The disclosure can be applied to another type of secondary battery such as a nickel-hydrogen battery, if the deterioration mode of the secondary battery includes the increase in the reaction resistance. Further, the battery 10 may be a polymer secondary battery (a lithium-ion polymer secondary battery or the like) having a gel-like electrolyte.

The embodiment of the disclosure will be briefly described. The ECU 100 executes the deterioration state estimation process of estimating the reaction resistance Rc of the battery 10. The deterioration state estimation process is a process of executing a process of calculating the long-period impedance of the battery 10 when the current value IB is varied with a long period and a process of calculating the short-period impedance of the battery 10 when the current value IB is varied with a short period, and estimating the reaction resistance Rc based on the difference between the long-period impedance and the short-period impedance. Each of the above processes is a process of varying the current IB and calculating a corresponding impedance from the change amount ($\Delta Va$) of the detection value of the voltage sensor 21 in a period in which the phase of the current IB is inverted from the initial phase to the opposite phase, the change amount ($\Delta Vb$) of the detection value of the voltage sensor 21 in a period in which the phase of the current IB is returned from the opposite phase to the phase equal to the initial phase, and the change amount ($\Delta I$)

of the current value between the time of the initial phase and the time of the opposite phase.

It should be understood that the embodiment disclosed herein is an example and is not limiting in all respects. It is intended that the scope of the disclosure is shown by not the above description of the embodiment but the claims, and includes all modifications in a meaning and scope equivalent to the claims.

What is claimed is:

1. A secondary battery system comprising:
a secondary battery that has an electrode including an active material, the electrode being impregnated with an electrolyte;
an electric circuit that includes at least one of a power supply circuit and a load circuit, the power supply circuit being configured to supply electric power to the secondary battery, the load circuit being configured to consume electric power of the secondary battery;
a voltage sensor that detects a voltage value of the secondary battery; and
a control device that controls current to be received or output by the secondary battery, by controlling the electric circuit, the control device being configured to execute a reaction resistance estimation process of estimating a reaction resistance, the reaction resistance being an impedance component relevant to transfer of an electric charge on an interface between the electrolyte and the active material, the control device being configured to execute a first calculation process and a second calculation process and estimate the reaction resistance based on a difference between a first impedance calculated in the first calculation process and a second impedance calculated in the second calculation process, in the reaction resistance estimation process, the first calculation process being a process of calculating the first impedance of the secondary battery when a current value of the secondary battery is varied with a first period, the second calculation process being a process of calculating the second impedance of the secondary battery when the current value of the secondary battery is varied with a second period shorter than the first period, each of the first and second calculation processes being a process of varying the current value with a corresponding period of the first and second periods and calculating a corresponding impedance of the first and second impedances based on a first change amount, a second change amount and a third change amount, the first change amount being a change amount of a detection value of the voltage sensor in a time period in which a phase of the current value is inverted from an initial phase to an opposite phase, the second change amount being a change amount of the detection value of the voltage sensor in a time period in which the phase of the current value is returned from the opposite phase to a phase equal to the initial phase, the third change amount being a change amount of the current value in a time period in which the phase of the current value is inverted from the initial phase to the opposite phase.

2. The secondary battery system according to claim 1, wherein each of the first and second calculation processes is a process of varying the current value with the corresponding period, acquiring a first detection value, a second detection value and a third detection value, and calculating the corresponding impedance based on a difference between the third detection value and the second detection value, a difference between the second detection value and the first detection value, and the third change amount, the first detection value being the detection value of the voltage sensor when the phase of the current value is the initial phase, the second detection value being the detection value of the voltage sensor when the phase of the current value is the opposite phase, the third detection value being the detection value of the voltage sensor when the phase of the current value is the phase equal to the initial phase.

3. The secondary battery system according to claim 2, wherein the control device calculates the corresponding impedance in accordance with Expression (A):

$$Z=\{(V3-V2)-(V2-V1)\}/2\Delta I \qquad (A)$$

where Z represents the corresponding impedance, V1, V2, and V3 represent the first, second, and third detection values respectively, and ΔI represents the change amount of the current value.

4. The secondary battery system according to claim 2, wherein
the control device varies the current value with a rectangular wave having the corresponding period, in each of the first and second calculation processes, and
each of the first, second, and third detection values is a value that is detected by the voltage sensor when half of the corresponding period has elapsed since a change in the current value.

5. The secondary battery system according to claim 1, wherein the control device executes the first and second calculation processes when at least one of a first condition, a second condition and a third condition is satisfied, the first condition being a condition that a magnitude of the current value is larger than a predetermined value, the second condition being a condition that a temperature of the secondary battery is lower than a predetermined temperature, the third condition being a condition that a state of charge of the secondary battery is lower than a predetermined level.

6. A deterioration state estimation method for a secondary battery, the secondary battery being provided with a voltage sensor that detects a voltage value of the secondary battery, the deterioration state estimation method for the secondary battery comprising:
calculating a first impedance of the secondary battery, from a first change amount, a second change amount and a third change amount when a current value of the secondary battery is varied with a first period;
calculating a second impedance of the secondary battery, from the first change amount, the second change amount and the third change amount when the current value of the secondary battery is varied with a second period shorter than the first period; and
estimating a reaction resistance based on a difference between the first impedance and the second impedance, the reaction resistance being an impedance component relevant to transfer of an electric charge on an interface between an electrolyte and an active material of the secondary battery,
the first change amount being a change amount of a detection value of the voltage sensor in a period in which a phase of the current value is inverted from an initial phase to an opposite phase, the second change amount being a change amount of the detection value of the voltage sensor in a time period in which the phase of the current value is returned from the opposite phase to a phase equal to the initial phase, the third change amount being a change amount of the current value in a time period in which the phase of the current value is inverted from the initial phase to the opposite phase.

* * * * *